(12) United States Patent
Miettinen

(10) Patent No.: US 7,109,780 B2
(45) Date of Patent: Sep. 19, 2006

(54) CONTROL CIRCUIT FOR SEMICONDUCTOR COMPONENT

(75) Inventor: Erkki Miettinen, Helsinki (FI)

(73) Assignee: ABB Oy, Helsinki (FI)

( * ) Notice: Subject to any disclaimer, the term of this patent is extended or adjusted under 35 U.S.C. 154(b) by 19 days.

(21) Appl. No.: 11/118,781

(22) Filed: May 2, 2005

(65) Prior Publication Data

US 2005/0248384 A1    Nov. 10, 2005

(30) Foreign Application Priority Data

May 10, 2004    (FI)    ................................ 20045171

(51) Int. Cl.
*H03K 17/687*    (2006.01)
(52) U.S. Cl. .................................................. 327/434
(58) Field of Classification Search ................ 327/427, 327/430–431, 434, 437
See application file for complete search history.

(56) References Cited

U.S. PATENT DOCUMENTS

| | | | |
|---|---|---|---|
| 5,210,479 A * | 5/1993 | Kimura et al. ............... | 318/727 |
| 5,383,082 A | 1/1995 | Nishizawa .................. | 361/93.1 |
| 5,500,616 A * | 3/1996 | Ochi ........................... | 327/310 |
| 5,530,385 A | 6/1996 | Miettinen .................... | 327/168 |
| 6,054,890 A * | 4/2000 | Giacomo ..................... | 327/375 |
| 6,094,087 A * | 7/2000 | He et al. ..................... | 327/434 |
| 6,972,611 B1 * | 12/2005 | Thalheim ..................... | 327/434 |

FOREIGN PATENT DOCUMENTS

EP    1 037 387    9/2000

OTHER PUBLICATIONS

Elcheik M. K. et al: "Commande En Tension Et En Courant D'Un IGBT", Revue Generale , De l'Electricite, RGE., Paris , FR, No. 2, Feb. 1, 1994, pp. 46-52, XP000426452, ISSN: 0035-3116.

* cited by examiner

*Primary Examiner*—My-Trang Nu Ton
(74) *Attorney, Agent, or Firm*—Dykema Gossett PLLC

(57) ABSTRACT

Control circuit for an IGB transistor, which comprises means (T1, V1, C3, C4) for generating auxiliary voltage, a first and a second controllable control switches (V8) connected in series between the auxiliary voltage, and a gate resistor (Rg). The control circuit further comprises a boost capacitor (Cg) connected in series with the gate resistor (Rg), a resistor (R3) whose first terminal is connected to the second terminal (4) of the boost capacitor and whose second terminal is connected to the intermediate voltage level of the auxiliary voltage of the control switches, a Zener diode (V9) whose anode is connected to the point between the gate resistor and the boost capacitor and whose cathode is connected to the point between the boost capacitor and the resistor (R3), and a diode (V10) whose anode is connected to the cathode of the Zener diode (V9) and whose cathode is connected to the positive terminal of the auxiliary voltage of the control switches.

4 Claims, 1 Drawing Sheet

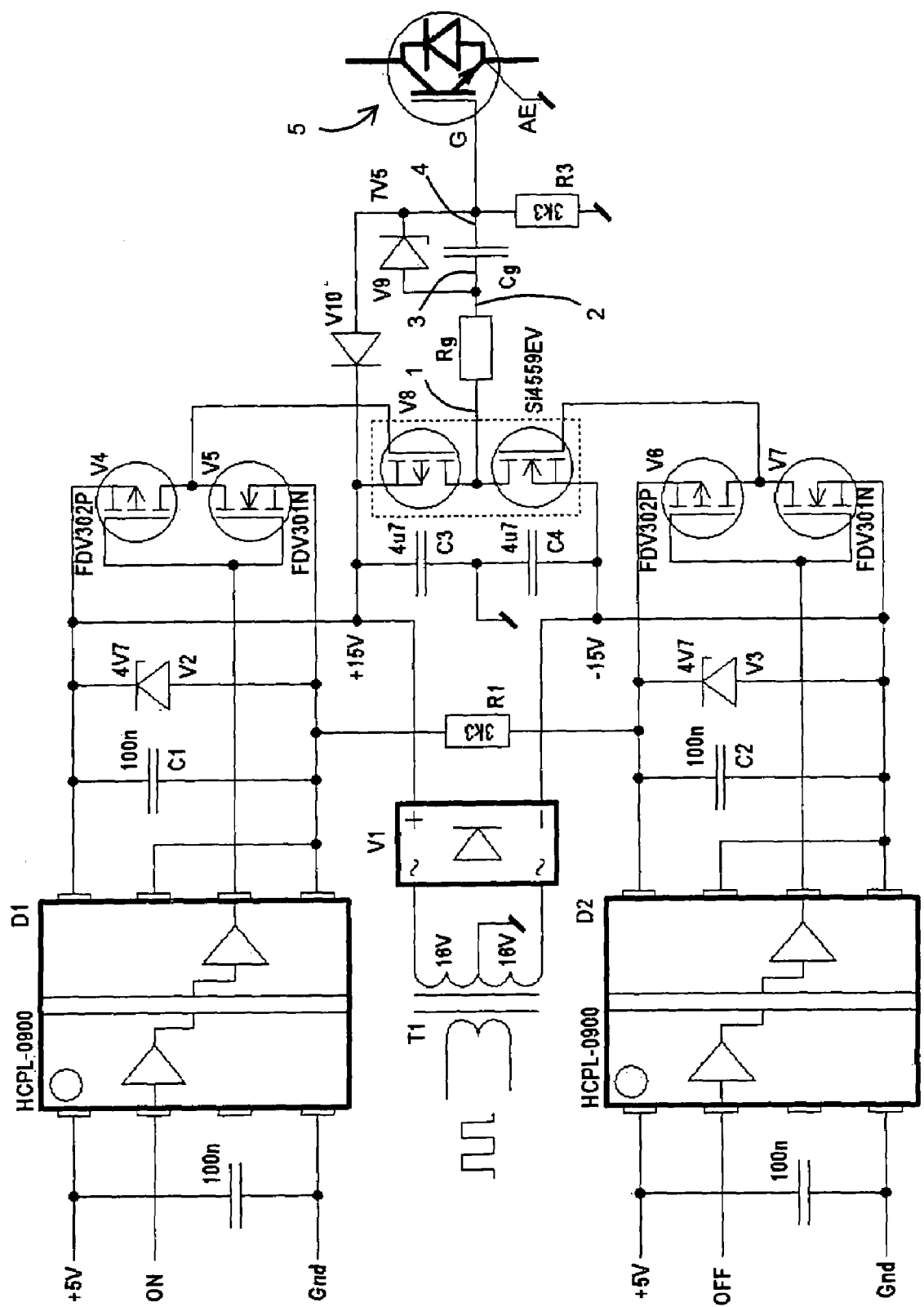

CONTROL CIRCUIT FOR SEMICONDUCTOR COMPONENT

BACKGROUND OF THE INVENTION

The invention relates to a control circuit of the preamble of claim 1 for a semiconductor component, particularly to a control circuit for an IGB transistor, to enable faster turn-on and turn-off of the transistor.

High-power IGB transistors typically have a gate charge of several microcoulombs and therefore in order to change transistor state quickly and with low losses, a current of several amperes has to be applied to control the gate. The gate voltage of an IGB transistor in a conducting state is typically of the order of +15 volts; if the voltage is too low, it may increase conduction losses in the component, whereas a gate voltage that is too high may destroy the component in case of a short-circuit. In a non-conducting state the gate voltage should achieve a negative value of at least 5 to 7 volts to prevent the capacitance between the collector and the gate from affecting the state of the gate in case of a rapid change in the collector voltage.

In change-over switches IGB transistors are usually in pairs and therefore to avoid a breakthrough situation during which the amount of current passing through the components might reach a full short-circuit current, the transistor that is currently on must be turned off before the opposite transistor is turned on. For this reason delays in power components should be as short and stable as possible. This can be achieved by providing the circuit with delay circuits that add what is known as dead time to the gate control of opposite components.

Accelerated gate control typically enables to achieve a decrease of as high as 20% in switching losses, which accounts for 10% of total losses.

The switching losses of IGB transistors depend on how rapidly a gate charge providing full conductivity can be fed to or removed from the component gate. The Miller plateau of an IGB transistor is typically at 10 to 11 volts and therefore the output voltage of the gate driver must be sufficiently high to allow current to be generated through the gate resistor.

It is easy to imagine that with an auxiliary voltage at +15 volts and the Miller plateau at 11 volts, an IGB transistor gate cannot be fed with a particularly high current. In a stationary state an increase in the auxiliary voltage alone may cause the risk of a component breakdown in case of short-circuit.

Although inexpensive gate driver microcircuits provided with a buffered output stage and galvanic separation implemented by means of optoelectronics are available, these circuits do not have a sufficient current supply capacity to control high-power IGB transistors. In addition, they usually have an output stage provided by means of bipolar technology, in which voltage loss in the direction of turn-on may be of the order of 2.5 volts. In other words, the difference to the voltage level of the Miller plateau of the IGB transistor is only 1.5 to 2.5 volts and thus rapid transfer of gate resistance is not possible.

To reduce voltage loss and to increase current supply capacity, the output of the circuits may be provided with a separate power stage, which is usually implemented by means of a p-type MOSFET connected from its source terminal to the positive supply voltage and by means of an n-type MOSFET correspondingly connected from its source terminal to the negative supply voltage. However, a problem that arises is that the gates of the buffer stage FET should be biased so that breakthrough cannot occur. This easily leads to a complicated and expensive end result.

Optically separated control circuits may have a transfer delay of several nanoseconds, and it may depend on the temperature, for example. For this reason dead time must be increased in the IGB transistors to be controlled in order to obtain a sufficient margin of certainty. On the other hand, using an extremely high-speed transformer connection for signal transfer usually increases costs and further complicates the circuit configuration.

Although gate drivers that remove the above problems are commercially available, they are usually very expensive and therefore not applicable to bulk products, such as frequency converters.

BRIEF DESCRIPTION OF THE INVENTION

It is an object of the invention to provide a control circuit in which the above disadvantages are avoided and which enables an IGB transistor to be controlled with lower losses than before and by means of affordable components. This is achieved by the control circuit of the invention, characterized by what is stated in the characterizing part of the independent claim. The preferred embodiments of the invention are disclosed in the dependent claims.

The basic idea of the invention is that a gate circuit of an IGB transistor is provided with wiring that reserves energy in the circuit capacitor to allow the IGB transistor to be turned on and off more rapidly.

The control circuit of the invention is implemented using known and tested components, thus ensuring that it functions reliably. In addition, since the circuit is simple, the configuration requires only a few, inexpensive components, which reduces both manufacturing costs and the size of the circuit board lay-out. Further, the control circuit of the invention provides a sufficient capacity for controlling an IGB transistor, and due to faster switching operations the IGB transistor to be controlled suffers from lower losses during switching.

BRIEF DESCRIPTION OF THE DRAWINGS

In the following the invention will be described in greater detail with reference to preferred embodiments and the accompanying drawing that shows a control circuit of the invention and a gate driver solution applicable in connection therewith.

DETAILED DESCRIPTION OF THE INVENTION

The FIGURE shows a control circuit of the invention and a circuitry associated therewith, i.e. a gate driver, for controlling an IGB transistor. This type of gate driver may be located in an electronic inverter, for example, for controlling an output IGB transistor. In that case a control system that is higher in the hierarchy informs when the IGB transistor is to be connected to and from a conductive state. In the example of the FIGURE the turn-on control of the IGB transistor is carried out by providing a digital separator D1 with a control command to an ON terminal. Correspondingly, to provide turn-off information, a digital separator D2 is provided with a control command to an OFF terminal.

In the embodiment of the Figure, galvanic separation of control signals is carried out by means of digital separators, such as HCPL-0900 or AduM-1100, which are extremely fast (max. transfer rate 18 ns), almost immune to the rate of voltage change acting across them, and approximately equally affordable as ten times slower optoisolators.

The secondary side of the gate driver is provided with a main auxiliary voltage generated in a commonly known manner by means of a transformer T1 and a rectifier V1 from a rectangular wave supplied to the primary side of the transformer T1. The auxiliary voltage of the embodiment is a bilateral voltage of ±15 volts and the voltages are filtered using capacitors C3 and C4. However, it is obvious that the level of the auxiliary voltages is set separately in each case such that after the IGB transistor has been turned on, its gate has a voltage with which the component is to be used.

The secondary side of the digital separators D1 and D2 is provided with auxiliary voltages of 4.7 volts generated from the main auxiliary voltage by Zener diodes V2, V3 and the resistor R1, and they are filtered using capacitors C1 and C2.

The output current of the digital separators is not sufficient for applying a direct control of a particularly rapid rate to the gates of control circuits V8 to be controlled. In the embodiment of the Figure the control switches to be controlled consist of an upper and lower terminal MOSFET V8. Therefore, in order to speed up the control, a buffer stage consisting of p-/n-type FETs V4/V5 and V6/V7 must be used between the digital separator and the terminal MOSFETs. To simplify the circuit these buffer FETs are connected to each other both at their drain and gate terminals. There is a tendency for a breakthrough current in this type of coupling if the gate voltage receives some other values than those of the source voltages. However, since the digital separator functions as a digital component whose output can only have two states, the situation does not appear for more than 10 ns at the most in connection with change of state. Since the operating voltage is low and the components selected for use have a fairly high ON resistance, the current does not achieve values higher than a few dozen milliamperes in this case either.

The buffer degree consisting of FETs V4/V5 functions such that when the output of the digital separator D1 connected to the gates of the FETs V4/V5 is low, the p-type FET V4 is conductive and connects the gate of the upper terminal FET V8 to a positive voltage, the upper terminal FET being thus in a blocking state. When the output of the digital separator goes up, the buffer FET V4 closes and, correspondingly, FET V5 becomes conductive and connects the gate of the upper terminal FET V8 to a voltage generated by the Zener diode V2 and lower than the auxiliary voltage, the voltage bringing the upper switch of the terminal FET to a conductive state.

Similarly, the lower switch of the terminal FET V8 is controlled by means of the output of the digital separator D2 through the buffer degree V6/V7 in such a way that when the OFF input of the digital separator D2 is high, the separator output is high as well. Thus the FET V7 is conductive and, as a result, the gate of the lower terminal FET V8 has a negative auxiliary voltage and it is therefore in a blocking state. When the OFF input goes down again, the switch V6 becomes conductive and connects the gate of the lower terminal FET V8 to a voltage generated by the Zener diode V3 and higher than the negative auxiliary voltage. This brings the lower FET into a conductive state.

The common gate charge of the buffer degree FETs is about 500 pC, which the 35 mA output current of the digital separator provides in less than 15 ns. As shown in the Figure, the drain terminals of the buffer degrees are coupled to the actual terminal FETs located in the same casing V8.

If both the upper and the lower terminal FETs V8 are controlled to turn on at the same time, a breakthrough liable to destroy the components will emerge. However, the control takes place at a very rapid and stable time plateau through digital separators whose outputs are typically connected to a digital logic, such as an FPGA circuit. With the logic the exact dead time required by the terminal degree V8 is easy to set.

In the turn-on control of the IGBT, the upper p-type terminal FET of V8 with its gate charge of about four nanocoulombs to the beginning of the Miller plateau, i.e. to 3.5 volts, has an important role. In this case the IGB transistor gate circuit already receives a drain current flow of four amperes at a drain source voltage loss of some volts. The buffer degree is capable of supplying the gates of the terminal degree FETs with a current of approximately one hundred milliamperes, so this point has been reached in about 40 ns, the total time taken for the control to reach the digital separator being 18 ns+15 ns+40 ns=73 ns. The terminal FET becomes saturated when its gate voltage rises, due to the buffer degree, to 4.7 volts, the drain-source resistance then being less than 0.2 ohms.

The n-type terminal FET, i.e. the lower switch of V8, that controls the turn-off of the transistor, functions in almost the same way. However, since the turn-off side has a multifold control voltage (−15 V minus the Miller plateau voltage plus the drain-source voltage=22V) compared to turn-on (+15 V minus the Miller plateau voltage minus the drain-source voltage =3V), the operation is quicker.

To speed up the turning on of the IGBT 5, its gate circuit is provided with a specific boost capacitor Cg added thereto in series with the gate resistor Rg in accordance with the invention. A first terminal 1 of the gate resistance is connected to a point between the terminal FETs V8 in a prior art manner. In accordance with the invention, a first terminal 3 of the boost capacitor is connected to a second terminal 2 of the gate resistor Rg. The boost functionality for accelerating the turn-on further comprises a Zener diode V9 and a resistor R3.

The control circuit of the invention is implemented by connecting the Zener diode V9 across the boost capacitor connected in series with the gate resistor, the anode of the Zener diode V9 being connected to the second terminal 2 of the gate resistor, i.e. to a point between the boost capacitor and the gate resistor, and the cathode in turn to the second terminal 4 of the boost capacitor. The resistor R3, in turn, is connected between the second terminal 4 of the boost capacitor and the intermediate voltage level of the auxiliary voltage, i.e. to the zero level of the auxiliary voltage in the embodiment of the Figure. The switching of the invention also includes a diode V10 connected between the positive voltage level of the auxiliary voltage and the cathode of the Zener diode in such a way that the anode of the diode is on the cathode of the Zener diode.

The functioning of the circuit of the invention will be explained below.

Let us first assume that the IGBT 5 has been controlled to turn off, i.e. the lower switch of the terminal FET V8 has pulled the gate resistor Rg to a voltage of −15 volts. The current flows through the resistor R3, whereby the capacitor Cg is charged to a voltage restricted by the Zener diode V9, which may typically be 7.5 volts. In this case the IGBT gate has a voltage of −7.5 volts with respect to its auxiliary emitter, i.e. the IGBT 5 is off. The Figure shows how an auxiliary emitter AE of the IGBT is connected to the zero potential of the auxiliary voltage, i.e. to the midpoint of the bilateral voltage.

If the gate driver now changes to the turn-on state, a connection is set up from a first end 1 of the gate resistor Rg to the positive auxiliary voltage, i.e. to +15 volts. Connected in series with the gate resistor there is the capacitor Cg, which has been left at a terminal voltage of 7.5 volts after the previous turn-off control. Since the IGBT gate G is at −7.5 volts, a voltage of 30 volts acts across the gate resistor Rg at the beginning of the turn-on, this voltage being the sum of the auxiliary voltage of 15 volts, the 7.5 volts of the boost capacitor and the 7.5 volt voltage of the gate itself. The magnitude of the gate current depends on the resistance of the gate resistor, but the gate charge increases very rapidly until the beginning of the Miller plateau, even if the voltage level of the plateau would vary to some extent.

It is evident that the energy of the boost capacitor Cg decreases as gate current passes through it, but by correct dimensioning of its capacitance in relation to the gate charge of the IGBT to be controlled, energy will be exhausted exactly at the point when the gate voltage of the IGBT has risen to the level of the positive supply voltage. If there is still energy left at that point, the gate voltage will tend to exceed that level, but diode V10 conveys the surplus energy to a filter capacitor C3. The diode V10 also prevents, in a prior art manner, the voltage of the IGBT gate to increase in case of a shortcircuit. On the other hand, if the energy of the boost capacitor Cg runs out too soon, the capacitor changes its terminal, but the Zener diode V9 prevents it from being charged to a terminal voltage higher than the diode voltage in the forward direction. As the turn-on situation continues, current flows through the resistor R3, which always causes the terminal voltage of the capacitor Cg to set to the forward direction voltage of the Zener diode V9.

Therefore, when the IGBT is being turned off, the boost capacitor Cg is charged with a forward direction voltage of V9, the amount of which further adds to the turn-off voltage at the beginning of the turn-off operation. Its significance is, however, only momentary; the current discharged from the IGBT gate reverses the polarity of the Cg again and charges it with the Zener voltage of V9. If the IGBT gate charge was not sufficient for charging the capacitor Cg to reach the Zener voltage, the resistor R3 supplies additional charge as the turn-off operation continues.

It is to be noted that the implementation of the Figure is shown by way of example only, and it contains the values and type information of the components in the entire control circuitry. However, it is obvious that the implementation of the drawing represents only one solution suitable for the control circuit of the invention and that the control circuitry can be implemented in various ways and using different component values and types.

A skilled person will therefore find it obvious that the basic idea of the invention can be implemented in various ways. The invention and its embodiments are therefore not restricted to the above examples, but they may vary within the scope of the claims.

The invention claimed is:

1. A control circuit for an IGB transistor, comprising:

means for generating an auxiliary voltage, the auxiliary voltage being generated so as to contain an intermediate voltage level to which an emitter or an auxiliary emitter of the IGB transistor is arranged to be connected;

a first and a second controllable control switch configured to be responsive to control signals of the means for generating for controlling the IGB transistor to and from a conductive state, the control switches being coupled in series between the auxiliary voltage; and a gate resistor whose first terminal is connected to a point between the first and the second control switches and which is arranged to a circuit to be connected to a gate of the IGB transistor, wherein the control circuit further comprises:

a boost capacitor connected in series with the gate resistor, a first terminal of the boost capacitor being connected to a second terminal of the gate resistor, and a second terminal of the boost capacitor being configured to be connected to the gate of the IGB transistor;

a resistor whose first terminal is connected to the second terminal of the boost capacitor and whose second terminal is connected to the intermediate voltage level of the auxiliary voltage of the control switches;

a Zener diode whose anode is connected to a point between the gate resistor and the boost capacitor and whose cathode is connected to a point between the boost capacitor and the resistor; and a diode whose anode is connected to the cathode of the Zener diode and whose cathode is connected to the positive terminal of the auxiliary voltage of the control switches.

2. A circuit according to claim 1, wherein the means for generating the auxiliary voltage comprise a voltage source and capacitors connected in series between the output voltage of the voltage source, the auxiliary voltage being arranged to consist of a voltage acting across the capacitors and the intermediate voltage level being arranged to consist of the point between the capacitors connected in series.

3. A circuit according to claim 2, wherein the auxiliary voltage is a bilateral voltage, the intermediate voltage level thus forming the zero level.

4. A circuit according to claim 1, wherein the first control switch is a p-type FET switch and the second control switch is an n-type FET switch.

* * * * *